United States Patent [19]

Rydborn

[11] Patent Number: 5,136,499
[45] Date of Patent: Aug. 4, 1992

[54] MONITORING FOR DISTINGUISHING NORMAL FROM ABNORMAL DEVIATIONS IN A KNITTING MACHINE

[76] Inventor: Sten Å. O. Rydborn, Klöxhultsvägen 21, 343 00, Älmhult, Sweden

[21] Appl. No.: 717,178

[22] Filed: Jun. 18, 1991

Related U.S. Application Data

[63] Continuation of Ser. No. 294,485, Dec. 27, 1988, abandoned.

[30] Foreign Application Priority Data

Jul. 7, 1986 [SE] Sweden .................................. 8603005

[51] Int. Cl.$^5$ .................... G06F 15/46; G06F 15/20; D04B 35/10; D03D 15/34
[52] U.S. Cl. .................... 364/185; 364/470; 364/552; 66/163; 139/370.2
[58] Field of Search .......................... 364/185, 470, 552

[56] References Cited

U.S. PATENT DOCUMENTS

| | | | |
|---|---|---|---|
| 3,242,321 | 3/1966 | Chope | 364/185 X |
| 4,145,748 | 3/1979 | Eichelberger et al. | 377/39 X |
| 4,384,596 | 5/1983 | Brouwer et al. | 139/370.2 |
| 4,491,831 | 1/1985 | Sakai et al. | 340/677 |
| 4,504,920 | 3/1985 | Mickowski | 364/552 X |
| 4,573,499 | 3/1986 | Sugita et al. | 139/370.2 |
| 4,628,710 | 12/1986 | Jacobsson | 66/163 X |
| 4,708,173 | 11/1987 | Yoshida | 139/370.2 |
| 4,713,655 | 12/1987 | Sommer et al. | 66/163 X |
| 4,720,702 | 1/1988 | Martens | 340/677 |
| 4,744,227 | 5/1988 | Whitener, Jr. et al. | 66/163 |
| 5,017,911 | 5/1991 | Muller et al. | 364/552 X |

FOREIGN PATENT DOCUMENTS

| | | | |
|---|---|---|---|
| 95779 | 12/1983 | European Pat. Off. | 139/370.2 |
| 2424957 | 12/1975 | Fed. Rep. of Germany | 66/157 |

*Primary Examiner*—Werner H. Schroeder
*Assistant Examiner*—John J. Calvert
*Attorney, Agent, or Firm*—Beveridge, DeGrandi & Weilacher

[57] ABSTRACT

A method and an apparatus for monitoring a plurality of successive signals to detect a loss of the successive signals and to detect whether the signals are substantially alike and do not deviate from each other by more than a recognized, acceptable extent. The monitored signals are converted to digital signals that are fed to a blocking and comparing circuit. The blocking and comparing circuit selectively permits generation of an alarm signal for indicating unacceptable deviations in the monitored signals. The monitored signals also are fed to a registration circuit which registers whether only recognized acceptable deviations are present in the digital signals and, if so, causes the blocking and comparing circuit to prevent generation of an alarm signal.

9 Claims, 7 Drawing Sheets

| FIG. 5A | FIG. 5B | FIG. 5C |

Fig. 5(c)

MONITORING FOR DISTINGUISHING NORMAL FROM ABNORMAL DEVIATIONS IN A KNITTING MACHINE

This application is a continuation of application Ser. No. 07/294,485, filed Dec. 27, 1988, now abandoned.

BACKGROUND OF THE INVENTION

The present invention relates to a method for monitoring that a plurality of mutually subsequent signals have substantially the same appearance and, thereby, are substantially alike, and for triggering an alarm and/or stop function on signal loss and/or the occurrence of one or more unknown and unacceptable deviations in the monitored signal, and for preventing triggering of an alarm and/or stop function on the occurrence of one or more known and acceptable deviations in the appearance of the monitored signal. The present invention further relates to an apparatus for carrying out the method.

In many contexts, it is fraught with serious problems to monitor electric signals which correspond, for instance, to thread movements in different types of machines, such as looms, since, in the continuous signals, there may occur signal gaps which are acceptable and are to be ignored. The most common monitoring method is to monitor that the signals'continuity is not broken. Furthermore, it is extremely difficult to pinpoint the occurrence of one or more signal gaps in the otherwise continuous signal, since this gap or these gaps do not always occur at the same position in the signal, but instead the occurrence of the signal gap or gaps has proved to be dependent on such factors as machine type, thread variety, thread quality etc. This has led to extremely complicated adjustment and fine-tuning problems, as well as extensive post-installation adjustments.

SUMMARY OF THE INVENTION

The task forming the basis of the present invention is to realize a method and an apparatus for obviating the above-outlined problems and drawbacks, or at least reducing them to an acceptable level.

This task is solved according to the present invention in that the method and apparatus disclosed by way of introduction have the features set forth in the appended claims.

As a result of the method and the apparatus according to the present invention, there will be realized an extremely simple methodology and an extremely simple apparatus for reliable and dependable monitoring of a continuous signal, within which there may occur natural variations which are to be ignored, without the need arising for any extensive fine-tuning or adjustment difficulties on any appreciable scope. This is because the apparatus according to the present invention may be considered as an autodidactic or self-learning monitoring circuit which, during a number of machine revolutions, learns the appearance of that signal which is to be monitored, since it may, with great probability, be assumed that the signal will continue to have the same appearance as it had during the so-called learning phase.

The method and the apparatus according to the present invention afford particular advantages in machines for knitting of different products, for instance socks. In this case, the signal from the thread or yarn movement sensors in each machine or pattern stage is memorized from the beginning of the product or the pattern to its end, whereafter the sensed and monitored signal is compared with the memorized signal. In this way, there will be achieved an extremely effective and efficient product quality control, whereby it will be assured not only that the thread, and possibly the threads, in each revolution are whole and unbroken, but also that the product is of the correct pattern and thread or yarn mix.

DESCRIPTION OF THE DRAWINGS

The present invention will be described in greater detail below with reference to the accompanying Drawings.

DETAILED DESCRIPTION OF THE PREFERRED EMBODIMENTS

Figure 1:
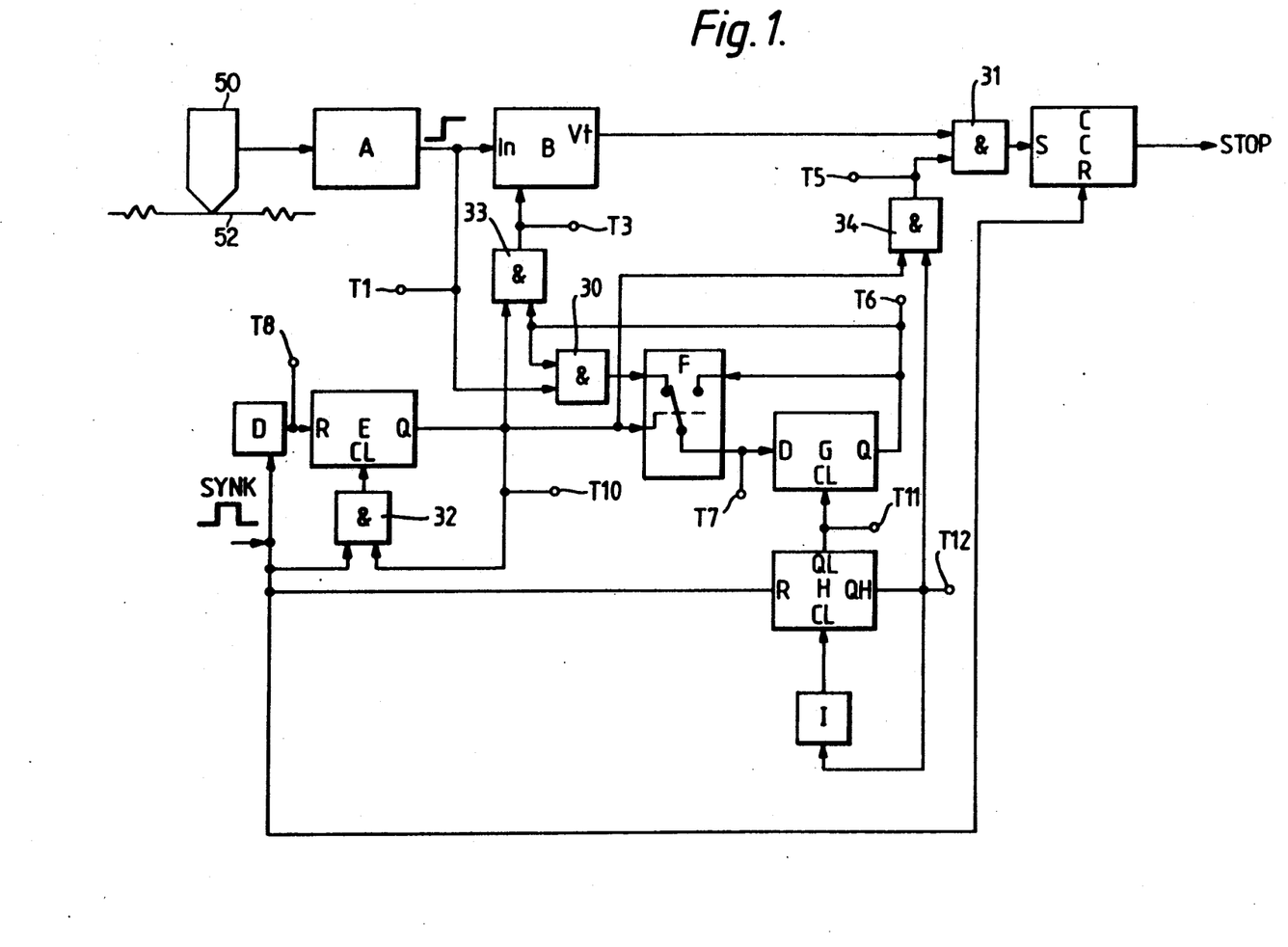
FIG. 1 is a block diagram of an apparatus according to the present invention.
Figure 2:
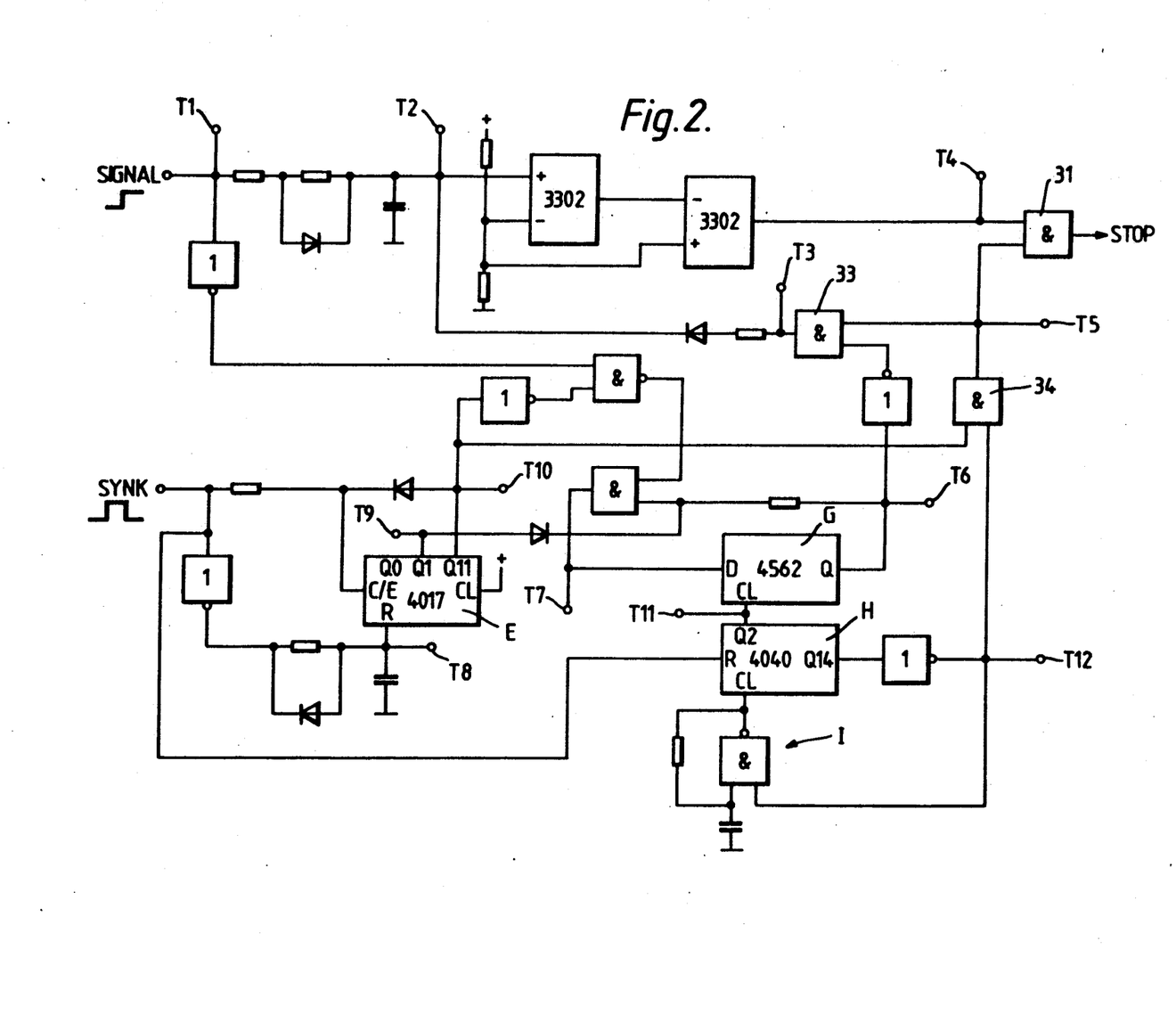
FIG. 2 is an outline diagram of the apparatus according to the present invention illustrated in FIG. 1.
Figure 3:
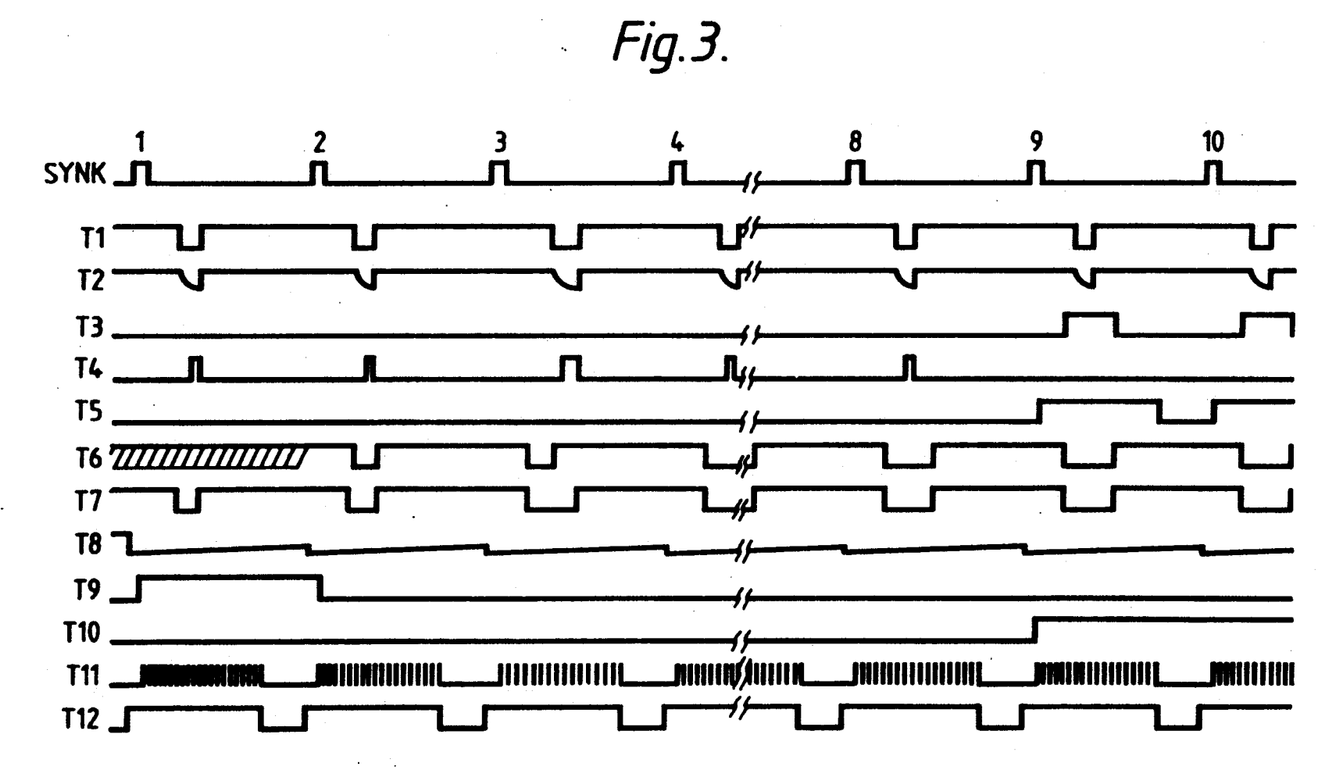
FIG. 3 shows a pulse diagram illustrating pulses from measurement points indicated in the block diagram and the outline diagram.

One embodiment of a method and an apparatus according to the present invention will now be described in greater detail with reference to the block diagram in FIG. 1, the outline diagram in FIG. 2 and the pulse diagram in FIG. 3. A signal emitter of some suitable type which, in response to for example, parameters such as the movement of a thread 52 in the tension thereon in a loom, generates an electric signal, is connected to a circuit A for amplification and digitalization of the signal to provide a digital signal comprising a plurality of bits. Suitably, the signal emitter may be of the piezoelectric type, but it is also conceivable to employ other types of signal emitters. The amplification and digitalization circuit is coupled to a blocking circuit B and to an AND gate 30. The output of the blocking circuit B is coupled to an AND gate 31 whose output is coupled to an alarm and/or stop function trigger circuit C which may be a flip-flop, or one shot circuit of some suitable type and which may, in, for instance a loom, be caused to emit a stop signal to the loom on the occurrence of an output signal from the AND gate 31.

As has been mentioned earlier, there may occur, in the signal from the amplification and digitalization circuit A, normal and known and acceptable signal gaps. However, these gaps do not always occur at exactly the same position in the signal and it is necessary to inform, in one way or another, the monitoring circuit that it is to ignore such known, normal and acceptable signal gaps. In accordance with the illustrated embodiment of the present invention, a synchronization pulse — hereinafter designated sync-pulse — emitter is coupled to a circuit D, which may be considered as a filter for control of the presence of sync-pulses which indicate that the machine is in operation, to an AND gate 32, to a counter circuit H and to the trigger circuit C. The output from the filter D is coupled to the reset input R of a counter circuit E, whose Q output is coupled to the AND gate 32, an AND gate 33 and an electronic switch F. The output of the AND gate 32 is coupled to the clock pulse input CL of the counter E, which is adjustable and operative to count a certain number of sync-pulses from start, before emitting an output signal on the output Q. The switch F is a so-called logic switch and its one input is coupled to the output from the AND gate 30 and its other input to the output from a shift register G, while the output of the switch F is coupled to the input D of the shift register G. The output of the shift register G is further coupled to the one input of the AND gates 30 and 33. The Q output of the counter circuit E is, moreover, coupled to the one input of an AND circuit 34. The clock pulse input of the shift register G is coupled to the QL output from the counter H whose reset inputs are coupled to the sync-pulse emitter and whose clock pulse input CL is coupled to a clock pulse generator I. The input of the clock pulse generator I is coupled to the output QH of the counter H and to the one input of the AND circuit 34. The output from the AND gate 33 is coupled to the blocking input of the blocking circuit B.

The above-described embodiment of the present invention may suitably be applied to a loom of the type in which the thread is propelled in through the shed by means of a projectile, water jet, air jet or some other medium, is caught on the other side of the shed and is thereafter retracted a distance. During this retraction, it is desirable to sense whether the thread is whole or not. In such an event, as was mentioned above, one or more signal gaps will occur in the signal emitter of varying types both in amplitude and position. As will be apparent from the outline diagram according to FIG. 2, the signal evaluation circuit includes an RC link or loop between the measurement points T1 and T2, the capacitor being employed to permit certain variations in the signal, while if the variations become too great, a signal will occur on the output of the comparator which is inverted and fed further to the AND gate 31 and flip-flop C for stopping the machine. In order to avoid stopping the machine on the occurrence of known and acceptable gaps in the signal, a signal is fed via the AND gate 33 to the measurement point T2 so as to fill-out the known and normal, and acceptable gaps in the signal to the RC link, such that the capacitor therein will not have time to discharge and give rise to an output signal to the AND gate 31. The signal from the AND gate 33 is obtained with the assistance of the shift register G. As is particularly apparent in the pulse diagram in FIG. 3, the shift register learns, during the first eight machine revolutions or sync-pulses, where in the signal a signal gap occurs, and is caused to generate a signal corresponding to the signal gap for feeding to the blocking circuit B via the AND gate 33.

In the counter circuit E, the number of machine revolutions is set which is deemed to be necessary in order that the shift register G learn where in the signal T1 a signal gap or several signal gaps occur. The counter H determines the shift interval of the shift register G. During the sync-pulses 1-8, the counter circuit E holds the switch F in the position illustrated in FIG. 1, in which both the signal from the circuit A and the signal from the shift register G influence the output signal from the AND gate 30, such that the shift register takes account of all of the signals T1 occurring during the preceding 1-8 sync-pulses. At the ninth sync-pulse, the counter circuit E will throw the switch F to the opposite position in relation to that illustrated in FIG. 1. Thereafter, the shift register G will be deemed to have earned the configuration or appearance of the signal which is to be monitored. Thereafter, the shift register contents will not be influenced until after a stop in the machine, whereupon a new learning phase may be initiated. Even if the signal T1 is shown as continuous in the pulse diagram according to FIG. 3, there is, naturally, nothing to prevent the occurrence of known and desired additional breaks therein between the sync-pulses over and above the illustrated discontinuation or break. One such additional break may be the end of the signal and, in certain applications, it may be desirable to monitor that the signal ends at the same position in every machine cycle.

The configuration, and thereby the appearance of the monitored signal may vary from thread quality to thread quality and from machine to machine, and furthermore threads of different colours may give different signal appearances, for which reason there is often provided, in a multi-coloured manufacturing machine, one apparatus of the type described in the foregoing for each thread variety and thread colour.

Figure 4:
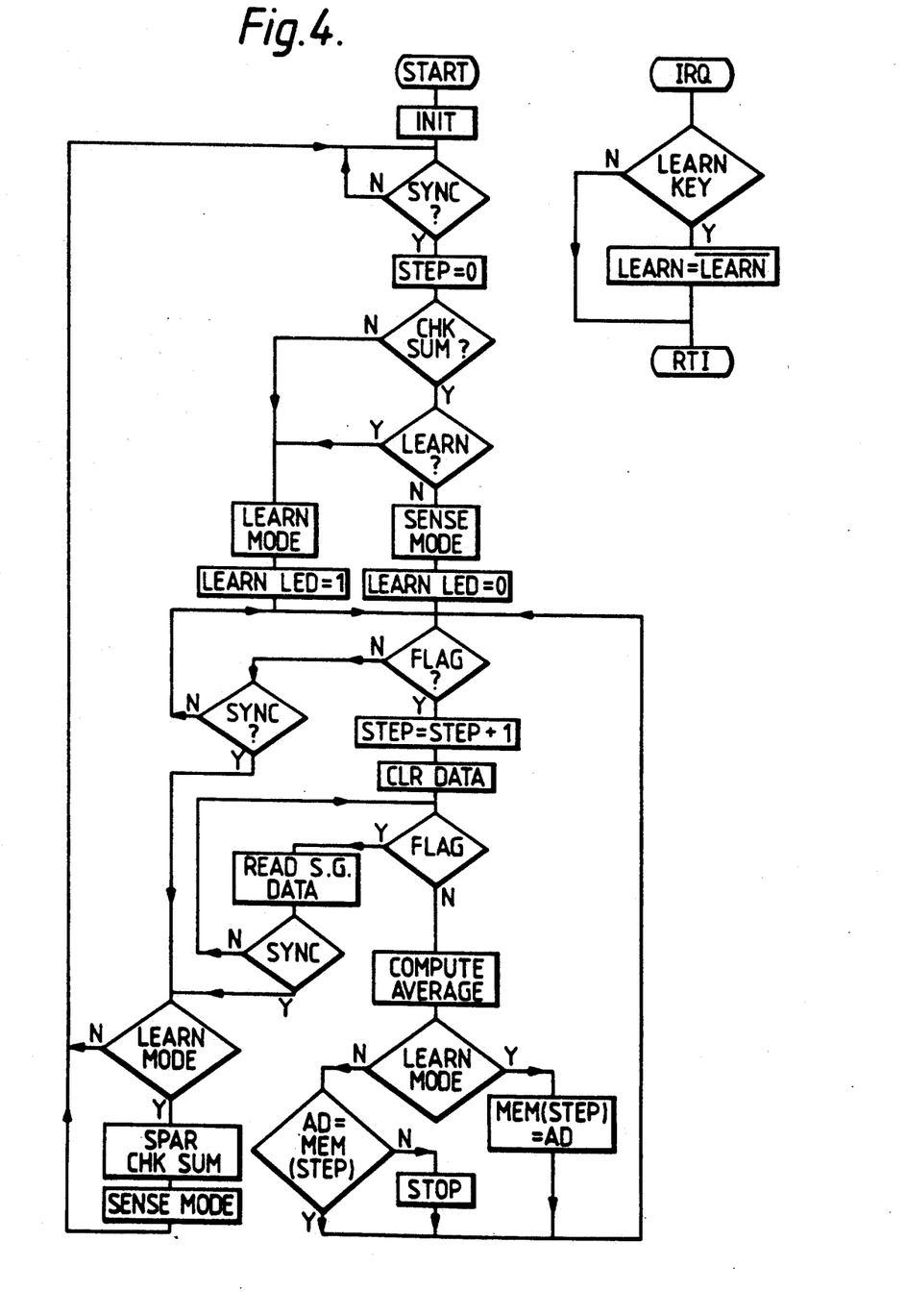
FIG. 4 is a flow diagram of one physical application of the present invention.
Figures 5, 5B:
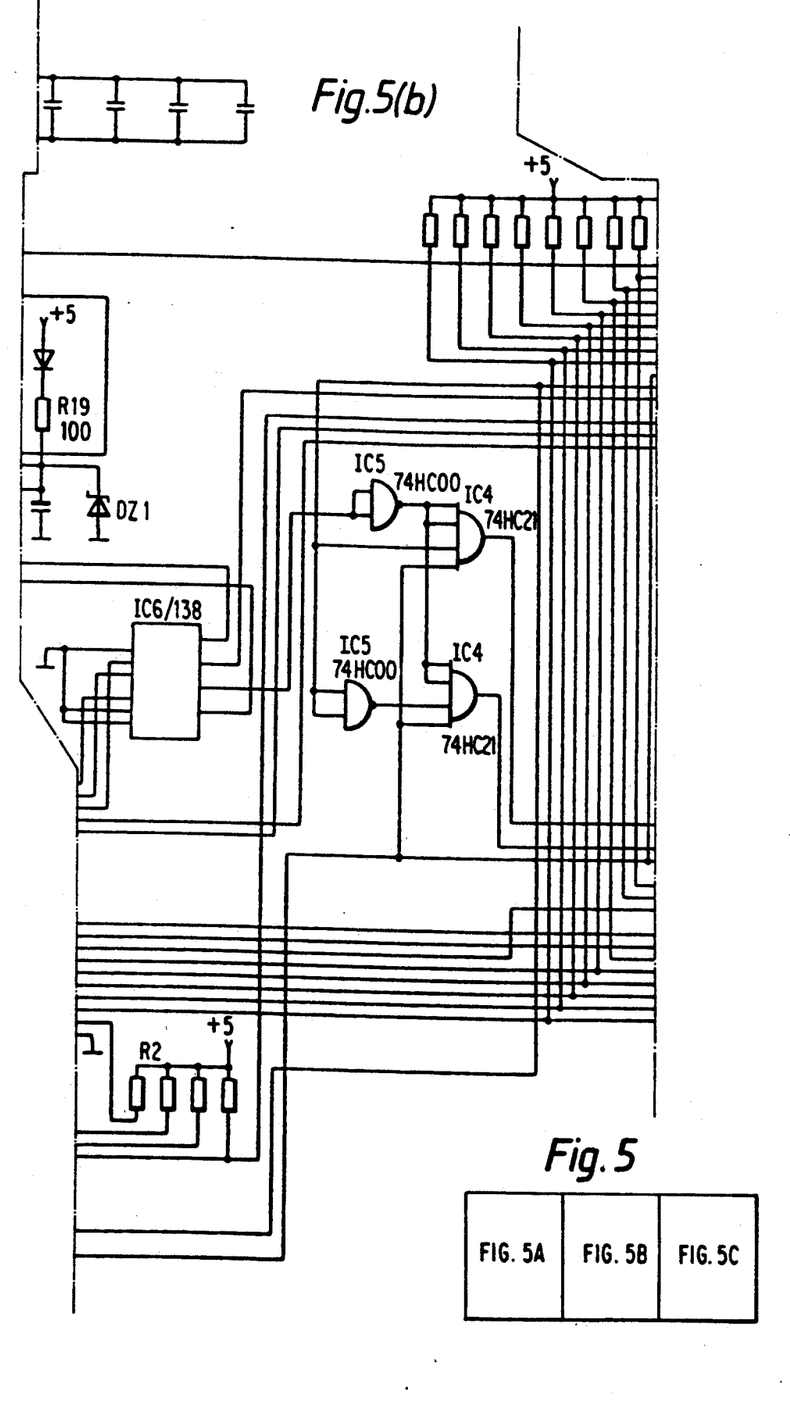
FIG. 5A-C are block diagrams of one embodiment for carrying out the invention according to FIG. 4.
Figure 5A:
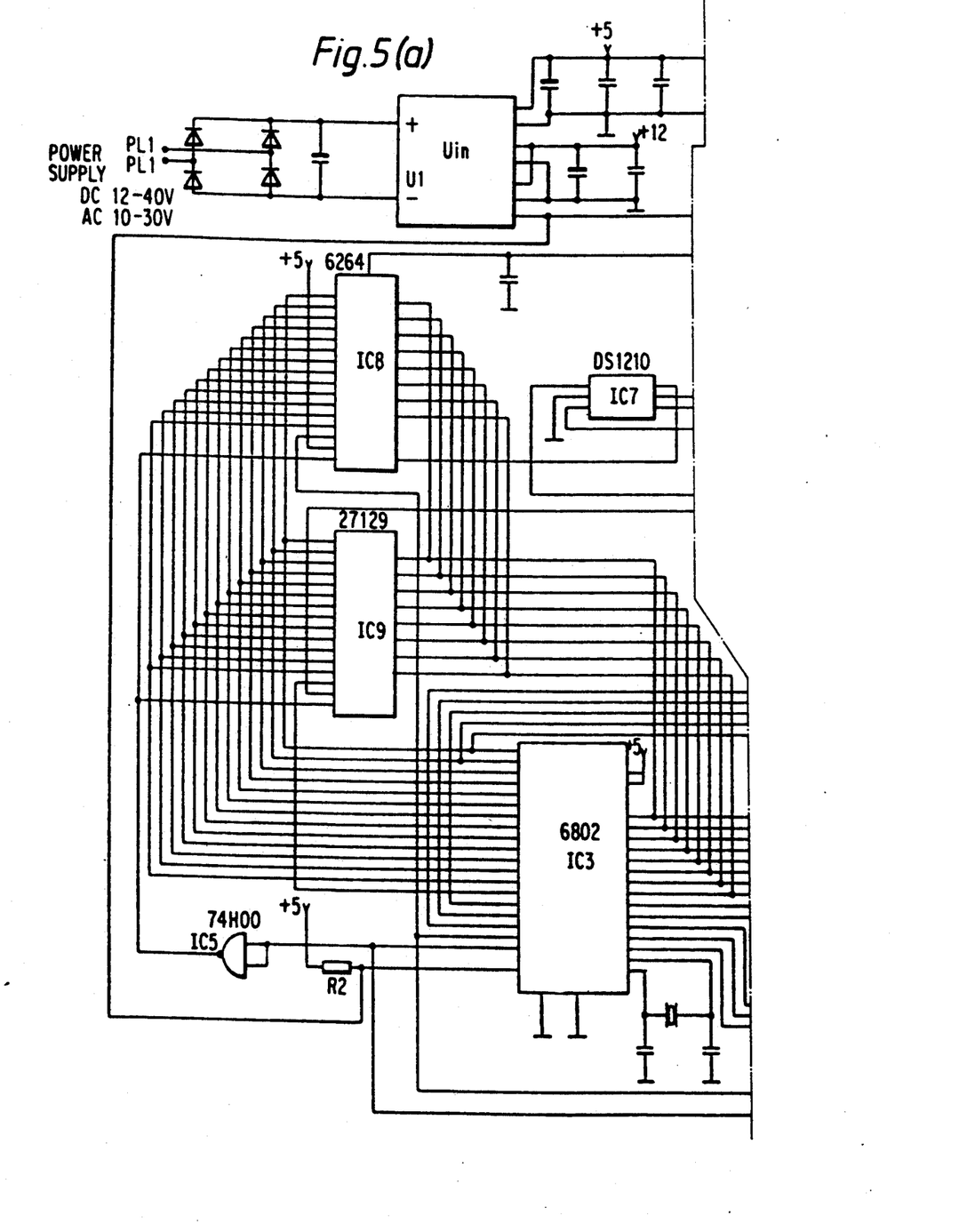
Figure 5C:
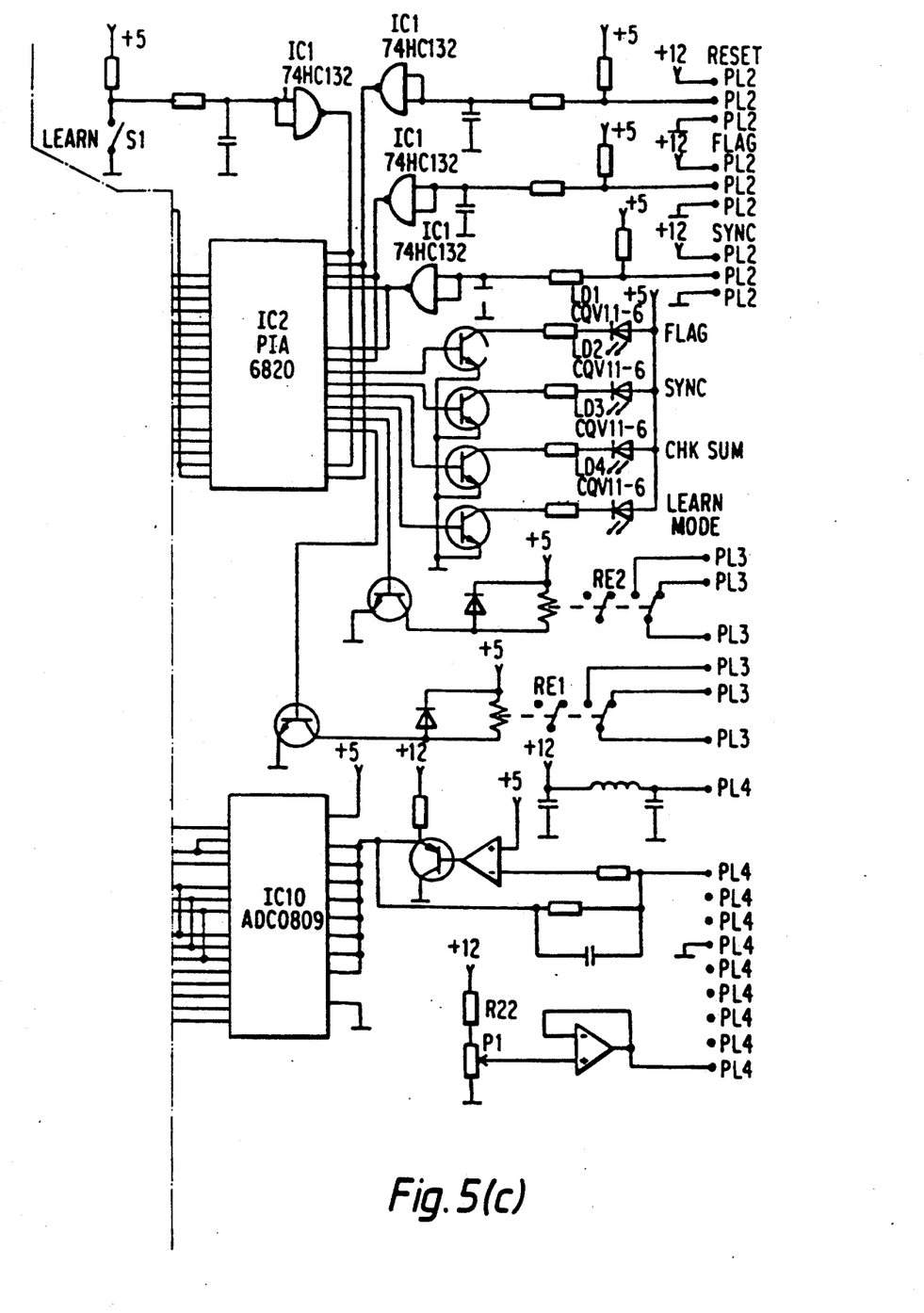

Furthermore, as illustrated in FIGS. 4 and 5, one embodiment of the present invention may be applied on a machine for knitting of different types of products, for instance stockings or socks. Each one of the included threads is allocated an emitter which is operative to emit an electric signal on thread movement. Furthermore, the machine is provided with an emitter which is operative to generate an electric signal or flag pulse (designated "FLAG" in FIGS. 4 and 5) and which defines a thread movement sensing period during one machine revolution, which may also be designated a pattern stage or knitting revolution. The term machine revolution may also be taken to refer to a machine cycle. The product which is to be knitted consists of a number of knitting cycles or pattern stages which together form the product and its pattern. The machine also includes an emitter which is operative to generate an electric signal or sync-pulse ("SYNC" in FIGS. 4 and 5) on the commencement of each product, and thereby on the initiation of a new pattern.

The electronic coupling diagram illustrated in FIG. 5 is, in principle, self-evident to a person skilled in the Art and makes it possible for the skilled reader of this specification to reduce into practice an apparatus for monitoring the manufacture of stockings or socks in a knitting machine. Hence, FIG. 5 shows the hardware section, while FIG. 4 illustrates the software section or a flow diagram for the software section, which is also easy to reduce into practice according to generally accepted methods for a person skilled in this Art.

The hardware section according to FIG. 5 includes a number of integrated circuits 1-11 which are all currently available on the market. The integrated circuit IC3 is a micro-computer which is controlled by means of a program stored in the integrated circuit IC9, which is a read memory and contains the program requisite for the function of the circuit. The processor IC3 also provides a blocking and comparing circuit controlled by the program memory circuit IC9. The integrated circuit IC8 is a registration or memorization circuit. The integrated circuit IC10 is an Analog to digital (AD), converter, while the integrated circuit IC2 is both an input and output circuit. The integrated circuit IC7 is a battery back-up circuit for the registration circuit IC8, while the integrated circuit subunits IC4, IC5 and IC6 form decoder units. Otherwise, the symbols in the coupling diagram are of the generally accepted type. A switch S1 is connected to the input and output circuit IC2 for switching the apparatus to and from a learn mode or learn phase. Furthermore, there is connected, to the circuit IC2, a reset button "RESET", which, after actuation, always entails resetting of the electronic circuits and the program to the initial position. There is further coupled-in a sensor circuit "SENS" which receives a flag pulse which determines that period of time during which thread movement is to be sensed in each pattern stage or machine revolution. Moreover, a circuit unit "SYNC" is coupled to the input and output circuit IC2 for entry of a sync-pulse on commencement of each product. There are further connected to the input and output circuit IC2 a number of light emitting diodes (LEDs) LD1-LD4 for indicating the presence of a flag pulse, sync-pulse, check total CHK and learn mode, respectively. There are further coupled to the input and output circuit IC2 two relays RE1 and RE2. Relays RE1 and RE2 along with transistors T6 and T5 provide a trigger circuit. On the occurrence of a signal triggering an alarm and/or stop function, the relay RE1 entrains the lighting of an indication lamp or other type of signal emitter, while the relay RE2 entails stop of the machine.

All thread movement signal emitters included in the machine are coupled to the AD converter IC10 which provides a digitalization circuit and, as will be apparent, all emitters are of the current emitter type, such that the more threads there are in movement on each sensing, the greater will be the current to the AD converter, and the lesser will be the digital signal departing from the AD converter. With no input emitter signal, the digital signal will be an output signal having a value of 255. Using the integrated circuit IC11 and the potentiometer P1, the sensitivity of the signal emitters may be regulated.

Taking the flow diagram in FIG. 4 as the point of departure, the operational mode of the above-described circuitry will be described. Apart from the major flow from "START" to "STOP", or the next pattern stage, there is also an "INTERRUPT" flow which is made operative on the intentional desire for a learn phase which is initiated on every second depression of the current switch or switch S1 in FIG. 5. How the learn phase proceeds is apparent in the major flow. When current has been turned on and a number of initial coupling checks have been executed, the apparatus waits for a sync-pulse, which is the start pulse proper.

As soon as a sync-pulse occurs, it is ascertained that the pattern stage 0 has been introduced. On condition that the check total is correct, it is queried whether there is to be carried out a learn phase or a normal sensing phase. Prior to the commencement of a completely new product, for example a sock, a learn phase must, naturally, always be carried out, in which the light emitting diode LD4 is lit. Irrespective of whether the apparatus is in its learn mode or sensing mode, during which latter the light emitting diode LD4 is extinguished, the apparatus awaits a flag pulse which entails that pattern stage 1 has been commenced and CLR cleared, the registration circuit or memory circuit IC8 (the computer circuits) are cleared. As long as there is a flag pulse, the signal from the AD converter IC10 is read at very short intervals, eg. 100 microseconds and these readings are stored or registered in the memory circuit IC8. When the flag pulse disappears and the pattern stage and machine revolution have been completed, the mean value of the read-offs executed during the pulse flag is calculated and, if the apparatus is in the learn mode (LEARN), the resultant mean value is registered. If, on the other hand, the apparatus is in the sensing mode, the thus resultant mean value is compared with the value previously memorized during a learn phase of the signal in the pattern stage under consideration. If the difference between the mean value arrived at during the sensing operation does not deviate by more than a certain predetermined number of units from the memorized value, the apparatus passes to the next pattern stage, but if the difference is greater, a signal which triggers an alarm or stop function is generated, whereby the relays RE1 and RE2 are energized. After the finish of a complete product or a complete sock, which is approved after inspection, there will be, in the registration or memory circuit IC8, a signal value for each pattern stage which is, in the sensing mode (SENSE), to be compared with the calculated mean value of the sensed signal on normal running operation.

While FIG. 4 illustrates an automatic switching to the learn mode if the check total is incorrect, it is difficult, in most cases, to carry out an automatic learn mode run. If the check total is incorrect, this should lead to a signal triggering an alarm and/or stop function. In principle, all learn mode runs must be monitored and the subsequently finished product must be inspected before switching to the sensing mode is executed.

After running of a learn phase or learn mode and approval of the thus produced product, the signals for each pattern stage are stored in the registration or memory circuit IC8 and the machine may be run for manufacture of identical products for several days, several weeks or several months, without the necessity of implementing a new learn phase.

Thus, in every pattern stage, there may be included any given number of threads or yarns, and also threads or yarns of different types, since the apparatus senses every pattern stage and ascertains whether the thread movements sensed during the manufacturing operation give a signal in the present pattern stage which had previously been obtained with a so-called master sock or the first-manufactured sock, or the sock produced during the learn phase. Since, in every machine revolution or every pattern stage, an immense number of sensing operations is carried out, and since it is the mean value of all sensings which is compared with the previously memorized signal, certain deviations in the signal are permitted without therefore giving rise to machine stop.

When reading the appended claims in relation to the above-illustrated practical application of the present invention, the term a plurality of mutually subsequent signals will be understood as the signal from one and the same pattern stage in mutually subsequent products, but it may, naturally, just as well relate to signals from several mutually subsequent pattern stages in the same product, when the pattern stages are alike and the registered signals for each respective pattern stage are substantially alike or do not differ from one another more than by the predetermined number of units permitted between registered signal and sensed signal, i.e. the calculated mean value of a number of sensings of one and the same signal.

I claim:

1. An apparatus for monitoring signals from a signal emitter means to detect whether signals received therefrom have deviations that are no more than a recognized, acceptable deviation extent, said received signals including a reference signal representative of production of a master product, said apparatus comprising:

a digitalization circuit for digitizing signals received from the emitter means to provide digital signals representative thereof, the provided digital signals each comprising a number of bits;

a trigger circuit for generating an alarm signal indicating unacceptable deviations in a received signal from the signal emitter means;

a registration circuit for monitoring signal deviations in a provided signal from said digitalization circuit and generating a comparison reference signal which is based upon monitoring of deviations in the reference signal over a predetermined learning period which is initiated on commencement of production of said master product and which is terminated after completion of said master product, said comparison reference signal thereby indicating acceptable deviations in each signal received from the emitter means;

a blocking and comparing circuit, connected between said digitalization circuit and said trigger circuit, for comparing a provided signal from said digitalization circuit and said comparison reference signal from said registration circuit during a sensing period to determine whether said provided signal has deviations which are no more than said recognized acceptable extent, and for preventing said trigger circuit from generating its alarm signal if said provided signal does not have deviations which are more than said recognized acceptable extent and a switch which switches between said learning period and said sensing period, and which is connected to said blocking and comparing circuit for suppressing generation of an alarm signal by said trigger circuit during said learning period, said blocking and comparing circuit permits said trigger circuit to generate its alarm signal if, during said sensing period, a provided signal received by said blocking and comparing means varies by more than a predetermined amount from said comparison reference signal.

2. The apparatus as claimed in claim 1, wherein:

said apparatus monitors thread movements in the knitting of a product in which the threads included in the product are each associated with said emitter means that is operative to generate a signal indicative of a thread parameter, said emitter means generating a sync-pulse corresponding to a first pattern stage of the product and a flag pulse in each pattern stage corresponding to said sensing period in each said pattern stage, and said apparatus comprises a central unit including said registration circuit and said blocking and comparing circuit.

3. The apparatus as claimed in claim 2, comprising a reset switch connected to said central unit and said blocking and comparing circuit for switching said circuits to an initial state following generation of an alarm signal by said triggering circuit.

4. The apparatus as claimed in claim 1, wherein said registration circuit comprises means for determining the mean value of a provided signal received during said learning period.

5. A method of monitoring to detect whether a received signal has deviations which are no more than a recognized, acceptable extent, said method comprising the steps of:

digitizing a received signal to provide a digital signal representative thereof, said provided digital signal comprising a number of bits, and applying said provided digital signal to a blocking and comparing circuit which selectively permits generation of an output alarm signal by a triggering circuit to indicate that the received signal has deviations which are more than said acceptable extent, and to a registration circuit which recognizes acceptable deviations in said provided digital signal and causes said blocking and comparing circuit to prevent generation of an alarm signal when deviations in said provided digital signal are not more than said recognized, acceptable extent, said step of applying said digital signal comprises the step of registering said provided digital signal over a predetermined period of time, said predetermined period of time including at least a portion of one machine cycle in a knitting machine, said machine cycle corresponding to one knitting revolution in a knitted product or one pattern stage in the pattern for the knitted product, and said received signal corresponding to thread movements occurring during said machine cycles, said registering step by said registration circuit during said predetermined time period defining a learning period which is initiated on commencement of a master product and which is terminated after completion of the master product.

6. A method of monitoring production of a product by detecting whether a received signal representing steps in production of said product has deviations which are no more than a recognized, acceptable deviation extent, said received signals including a reference signal representative of production of a master product, said method comprising the steps of:

digitizing received signals representing said steps in production to provide digital signals representative thereof, said provided digital signals each comprising a number of bits;

generating a comparison reference signal which indicates deviations in said reference signal over a predetermined learning period to define said acceptable extent of deviation, said learning period being initialed on commencement of production of said master product and being terminated after completion of said master product;

comparing said comparison reference signal with another provided digital signal during a sensing period which begins after termination of said learning period to determine whether said another provided signal has deviations which are more than said acceptable extent;

generating an alarm signal by means of a triggering circuit if said another provided digital signal is determined to have deviations which exceed said acceptable extent, and preventing generation of said alarm signal if said another provided signal is not determined to have deviations which exceed said acceptable extent.

7. The method as claimed in claim 6, wherein said learning and sensing periods correspond to at least a portion of plural machine cycles in a knitting machine, said machine cycles corresponding to knitting revolutions in a knitted product or pattern stages in a pattern for the knitted product, and wherein said another provided digital signal corresponds to thread movements occurring during said machine cycles.

8. The method as claimed in claim 6, wherein said step of generating said comparison reference signal comprises determining the mean value of deviations in said reference signal, wherein said step of comparing comprises comparing deviations in said another provided digital signal with said mean value of deviations in said reference signal, and wherein said step of generating an alarm signal comprises generating said alarm signal if deviations in said another provided digital signal exceeds said mean value.

9. The method as claimed in claim 8, wherein said learning and sensing periods correspond to at least a portion of plural machine cycles in a knitting machine which produces said product, each machine cycle corresponding to a pattern stage, and wherein said step of comparing comprises subtracting a value corresponding to stored pattern stages from said mean value which is stored during a machine cycle, and wherein said step of generating an alarm signal comprises causing said triggering circuit to generate an alarm signal if a result of said step of subtracting exceeds a predetermined value.

* * * * *